US009023968B2

(12) United States Patent
Choi et al.

(10) Patent No.: US 9,023,968 B2
(45) Date of Patent: May 5, 2015

(54) METHOD FOR PRODUCING ORGANOPOLYSILOXANE

(71) Applicant: LG Chem, Ltd., Seoul (KR)

(72) Inventors: Bum Gyu Choi, Daejeon (KR); Min Jin Ko, Daejeon (KR); Myung Sun Moon, Daejeon (KR); Jae Ho Jung, Daejeon (KR); Dae Ho Kang, Daejeon (KR); Min Kyoun Kim, Daejeon (KR); Byung Kyu Cho, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/276,772

(22) Filed: May 13, 2014

(65) Prior Publication Data
US 2014/0249288 A1 Sep. 4, 2014

Related U.S. Application Data

(63) Continuation of application No. PCT/KR2012/010064, filed on Nov. 26, 2012.

(30) Foreign Application Priority Data

Nov. 25, 2011 (KR) .......................... 10-2011-0124658
Nov. 26, 2012 (KR) .......................... 10-2012-0134554

(51) Int. Cl.
| | |
|---|---|
| *C08G 77/06* | (2006.01) |
| *C08G 77/08* | (2006.01) |
| *C08G 77/20* | (2006.01) |
| *C08L 83/04* | (2006.01) |
| *H01L 23/29* | (2006.01) |
| *C08K 5/00* | (2006.01) |
| *C08G 77/12* | (2006.01) |
| *C08K 5/56* | (2006.01) |
| *H01L 33/56* | (2010.01) |

(52) U.S. Cl.
CPC .............. *C08G 77/08* (2013.01); *C08K 5/0025* (2013.01); *C08G 77/12* (2013.01); *C08G 77/20* (2013.01); *C08K 5/56* (2013.01); *C08L 83/04* (2013.01); *H01L 33/56* (2013.01); *H01L 23/296* (2013.01)

(58) Field of Classification Search
None
See application file for complete search history.

(56) References Cited

U.S. PATENT DOCUMENTS

| | | | |
|---|---|---|---|
| 4,046,795 A | 9/1977 | Martin | |
| 5,530,075 A * | 6/1996 | Morita et al. | 525/431 |
| 8,080,614 B2 * | 12/2011 | Morita et al. | 525/100 |
| 8,258,502 B2 * | 9/2012 | Yoshitake et al. | 257/40 |
| 8,299,186 B2 * | 10/2012 | Sagawa et al. | 525/478 |
| 2002/0161140 A1 * | 10/2002 | Yoneda et al. | 526/90 |
| 2004/0241927 A1 * | 12/2004 | Kato et al. | 438/202 |
| 2005/0212008 A1 * | 9/2005 | Miyoshi | 257/100 |
| 2006/0073347 A1 * | 4/2006 | Morita et al. | 428/447 |
| 2006/0081864 A1 * | 4/2006 | Nakazawa | 257/98 |
| 2007/0112147 A1 * | 5/2007 | Morita et al. | 525/478 |
| 2009/0099321 A1 * | 4/2009 | Yoshitake et al. | 525/475 |
| 2009/0118440 A1 * | 5/2009 | Nakanishi et al. | 525/478 |
| 2009/0123764 A1 * | 5/2009 | Morita et al. | 428/446 |
| 2011/0147955 A1 * | 6/2011 | Kashiwagi | 257/791 |
| 2013/0009201 A1 * | 1/2013 | Ko et al. | 257/100 |
| 2013/0187176 A1 * | 7/2013 | Ko et al. | 257/88 |

FOREIGN PATENT DOCUMENTS

| | | |
|---|---|---|
| KR | 10-2006-0096429 A | 9/2006 |
| KR | 1020070067717 A | 6/2007 |
| KR | 10-2011-0087243 A | 8/2011 |
| KR | 10-2011-0087244 A | 8/2011 |
| KR | 1020110087243 A | 8/2011 |
| WO | WO 2011090364 A2 * | 7/2011 |

OTHER PUBLICATIONS

Li, H. et al., "A novel and facile method for direct synthesis of cross-linked polysiloxanes by anionic ring-opening copolymerization with Ph12-POSS/D4/PH8D4", Polymer 2005, vol. 46, pp. 5317-5323.

Li, H. et al. "Direct synthesis and characterization of crosslinked polysiloxanes via anionic ring-opening copolymerization with octaisobutyl-polyhedral oligomeric silsesquioxane and octamethylcyclotetrasiloxane", Journal of Applied Polymer Science 2006, vol. 102, pp. 3848-3856.

* cited by examiner

*Primary Examiner* — Robert S Loewe
(74) *Attorney, Agent, or Firm* — McKenna Long & Aldridge, LLP

(57) ABSTRACT

A method of preparing an organopolysiloxane is provided. An organopolysiloxane, which has both a linear or cross-linking structure derived from a trifunctional siloxane unit and a linear structure derived from a difunctional siloxane unit among the molecular structures and also has a sufficiently long linear structure, can be effectively prepared. Also, the organopolysiloxane can be synthesized so that it can have a sufficiently high molecular weight, and a target product showing excellent physical properties can be effectively prepared by minimizing a ratio of a functional group such as an alkoxy group or a hydroxyl group in the synthesized organopolysiloxane.

16 Claims, No Drawings

METHOD FOR PRODUCING ORGANOPOLYSILOXANE

This application is a Continuation Bypass Application of International Application No. PCT/KR2012/010064, filed Nov. 26, 2012, and claims priority to Korean Application Nos. 10-2012-0134554, filed Nov. 26, 2012, and 10-2011-0124658, filed Nov. 25, 2011, all of which are hereby incorporated by reference in their entirety.

TECHNICAL FIELD

The present application relates to a method of preparing an organopolysiloxane.

BACKGROUND ART

A representative method of preparing an organopolysiloxane is a method of dehydrating and condensing an organosilane or organosiloxane containing a hydrolytic group such as an alkoxy group. For example, the patent document 1 disclosed a method of preparing an organopolysiloxane, which includes dehydrating a disiloxane, a dialkoxydiorganosilane and a trialkoxyorganosilane, followed by condensing the disiloxane, dialkoxydiorganosilane and trialkoxyorganosilane.

However, it is difficult to effectively prepare an organopolysiloxane having a desired structure using this method. For example, a polysiloxane having a sufficiently long linear structure including a difunctional siloxane unit may not be easily prepared using this method. Also, a polysiloxane having a structure in which silicon atoms of a difunctional siloxane unit are directly connected to silicon atoms of a trifunctional siloxane unit by means of oxygen atoms may not be easily realized using this method.

In this method, it is difficult to remove functional groups which take part in dehydration and condensation reactions, for example, a hydroxyl group or a hydrolytic functional group such as an alkoxy group, from the prepared organopolysiloxane. However, the residual functional groups may have an adverse effect on physical properties of the prepared organopolysiloxane.

PRIOR ART DOCUMENT

Patent Document (Patent Document 1) U.S. Pat. No. 4,046,795

DISCLOSURE

Technical Problem

The present application provides a method of preparing an organopolysiloxane.

Technical Solution

Illustrative preparation method may include reacting a mixture including a siloxane compound having a ring structure and an organopolysiloxane having a cage structure or a partial cage structure or containing a trifunctional siloxane unit. As such, the mixture may include all of a siloxane compound having a ring structure, an organopolysiloxane having a cage structure, an organosiloxane having a partial cage structure and an organopolysiloxane containing a trifunctional siloxane unit, or may include a siloxane compound having a ring structure and at least one or two of the other components. According to one illustrative embodiment, the reaction of the mixture may be a ring-opening polymerization reaction.

Examples of the siloxane compound having a ring structure may include a compound represented by the following Formula 1. Also, examples of the organopolysiloxane having a cage structure or partial cage structure or containing a trifunctional siloxane unit may include an organopolysiloxane represented by an average composition formula of the following Formula 2 or 3:

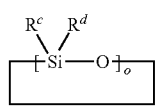

Formula 1

$[R^e SiO_{3/2}]$

Formula 2

$[R^a R^b_2 SiO_{1/2}]_p [R^e SiO_{3/2}]_q$

Formula 3

In Formulas 1 to 3, $R^a$ is a monovalent hydrocarbon group having at least two carbon atoms, $R^b$ is an alkyl group having 1 to 4 carbon atoms, $R^c$ to $R^e$ are each independently an alkyl group having 1 to 20 carbon atoms, an alkenyl group having 1 to 20 carbon atoms, or an aryl group having 6 to 25 carbon atoms, o is an integer ranging from 3 to 6, p is an integer ranging from 1 to 3, and q is an integer ranging from 1 to 10.

In this specification, an organopolysiloxane represented by a predetermined average composition formula includes a case in which an organopolysiloxane is composed of a single component represented by the predetermined average composition formula, as well as cases in which the organopolysiloxane is composed of a mixture of at least two components or the mixture that is a reaction product, and an average composition of the two components in the reaction product is represented by the predetermined average composition formula.

When an organopolysiloxane having a partial cage structure and/or containing a unit T reacts with the siloxane compound having a ring structure, an organopolysiloxane which has a desired structure and whose physical properties such as molecular weight are also controlled within a desired range may be synthesized. According to the method, since monomer components forming an organopolysiloxane do not contain a condensable functional group, a target product having excellent physical properties may also be prepared by minimizing a ratio of a functional group bound to a silicon atom, such as an alkoxy group or a hydroxyl group, in the synthesized organopolysiloxane.

In this specification, the term "monovalent hydrocarbon group" may refer to a monovalent residue derived from an organic compound composed of carbon and hydrogen atoms, or a derivative thereof. The monovalent hydrocarbon group has 1 or 2 carbon atoms. According to another illustrative embodiment, the monovalent hydrocarbon group may be a monovalent hydrocarbon group having 1 to 25 carbon atoms, or 2 to 25 carbon atoms. For example, the monovalent hydrocarbon group that may be used herein may include an alkyl group, an alkenyl group, or an aryl group.

Unless particularly defined otherwise in this specification, the term "alkyl group" may refer to an alkyl group having 1 to 20 carbon atoms, 1 to 16 carbon atoms, 1 to 12 carbon atoms, 1 to 8 carbon atoms, or 1 to 4 carbon atoms. The alkyl group may have a linear, branched or cyclic structure, and may be optionally substituted with one or more substituents.

Unless particularly defined otherwise in this specification, the term "alkenyl group" may refer to an alkenyl group having 2 to 20 carbon atoms, 2 to 16 carbon atoms, 2 to 12 carbon atoms, 2 to 8 carbon atoms, or 2 to 4 carbon atoms. The alkenyl group may have a linear, branched or cyclic structure, and may be optionally substituted with one or more substituents.

Unless particularly defined otherwise in this specification, the term "aryl group" may refer to a monovalent residue derived from a compound or a derivative thereof, which contains a benzene ring and has a structure in which two or more benzene rings are connected or condensed. That is, a category of the term "aryl group" may generally include an aralkyl group or an arylalkyl group in addition to the aryl groups normally referred to as aryl groups. For example, the aryl group may be an aryl group having 6 to 25 carbon atoms, 6 to 21 carbon atoms, 6 to 18 carbon atoms, or 6 to 13 carbon atoms. Examples of the aryl group may include a phenyl group, a dichlorophenyl, a chlorophenyl, a phenylethyl group, a phenylpropyl group, a benzyl group, a tolyl group, a xylyl group, or a naphthyl group. For example, a phenyl group may be used herein.

When definition of the alkyl group is applied to a monovalent hydrocarbon group having at least two carbon atoms, a lower limit of the number of the carbon atoms may be 2.

In Formula 3, the alkyl group having 1 to 4 carbon atoms may be a linear, branched or cyclic alkyl group, and may be optionally substituted with one or more substituents. In average composition formula of Formula 3, $R^b$ may be, for example, a methyl group.

In this specification, examples of the substituent which may be optionally substituted with the monovalent hydrocarbon group, the alkyl group, the alkenyl or the aryl group may include a halogen, an epoxy group, an acryloyl group, a methacryloyl group, an isocyanate group, a thiol group, or the above-described monovalent hydrocarbon group (including a hydrocarbon group having one carbon atom), but the present application is not limited thereto.

In Formulas 1 to 3, specific kinds of the monovalent hydrocarbon group and the alkyl group having 1 to 4 carbon atoms, and the numbers of o, p and q may, for example, be determined according to the specific kind of an organopolysiloxane to be prepared.

According to one illustrative embodiment, at least one of $R^c$ and $R^d$ in Formula 1 may be an aryl group. The aryl group may be optionally substituted with one or more substituents. According to one illustrative embodiment, $R^e$ in Formula 2 or 3 may be an aryl group. The aryl group may be optionally substituted with one or more substituents. Examples of the aryl group of $R^c$, $R^d$ and $R^e$ may, for example, include a phenyl group, a tolyl group, a xylyl group, or a naphthyl group. In general, a phenyl group may be used, but the present application is not limited thereto.

The mixture may include the organopolysiloxane having the cage and/or partial cage structure or containing the trifunctional siloxane unit at a content of 1 to 80 parts by weight, 1 to 70 parts by weight, 1 to 60 parts by weight, 1 to 50 parts by weight, 1 to 40 parts by weight, or 1 to 30 parts by weight, based on 100 parts by weight of the siloxane compound having a ring structure. The content of the organopolysiloxane is just one illustrative embodiment, and may be, for example, altered in consideration of a desired structure of the organopolysiloxane. Unless particularly defined otherwise in this specification, the unit "part(s) by weight" refers to a weight ratio between respective components.

According to one illustrative embodiment, a mixture of a compound represented by the following Formula 4 and a compound represented by the following Formula 5 may be used as the compound of Formula 1 that is a siloxane compound having a ring structure. An organopolysiloxane having a desired structure may be effectively prepared through use of such a compound.

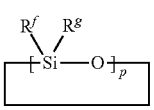

Formula 4

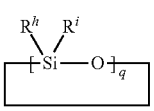

Formula 5

In Formulas 4 and 5, $R^f$ and $R^g$ are each independently an alkyl group having 1 to 20 carbon atoms, $R^h$ and $R^i$ are each independently an aryl group having 6 to 25 carbon atoms, p is an integer ranging from 3 to 10, and q is an integer ranging from 3 to 10.

A usage ratio of the compounds of Formulas 4 and 5 is not particularly limited, and may be selected in consideration of reactivity or a desired structure of the organopolysiloxane.

According to one illustrative embodiment, the mixture may further include a compound represented by the following Formula 6 as a reaction product.

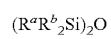 $(R^a R^b{}_2 Si)_2 O$     Formula 6

In Formula 6, $R^a$ is a monovalent hydrocarbon group having at least two carbon atoms, and $R^b$ is an alkyl group having 1 to 4 carbon atoms.

In Formula 6, specific examples of the monovalent hydrocarbon group and the alkyl group having 1 to 4 carbon atoms are as listed in Formulas 1 to 3, and specific kinds of $R^a$ and/or $R^b$ may, for example, be determined according to a desired structure of the organopolysiloxane.

The compound of Formula 6 may be included in the mixture at a content of 1 to 70 parts by weight, 1 to 60 parts by weight, 1 to 50 parts by weight, 1 to 40 parts by weight, 1 to 30 parts by weight, or 1 to 20 parts by weight, based on 100 parts by weight of the siloxane compound having a ring structure. The content of the compound of Formula 6 is just one illustrative embodiment, and may, for example, be altered in consideration of a desired structure of the organopolysiloxane.

According to one illustrative embodiment, the reaction of the mixture may be performed in the presence of a catalyst.

For example, a base catalyst may be used as the catalyst. Proper examples of the base catalyst may include a metal oxide such as KOH, NaOH, or CsOH, a metal silanolate including an alkaline metal compound and siloxane, or a quaternary ammonium compound such as tetramethylammonium hydroxide, tetraethylammonium hydroxide, or tetrapropylammonium hydroxide, but the present application is not limited thereto.

An amount of the catalyst used may be properly selected in consideration of desired reactivity. According to one illustrative embodiment, the catalyst may be used at a content of 0.01 to 30 parts by weight, 0.01 to 25 parts by weight, 0.01 to 20 parts by weight, 0.01 to 15 parts by weight, 0.01 to 10 parts by weight, or 0.03 to 5 parts by weight, based on 100 parts by weight of the mixture, but the present application is not limited thereto.

According to one illustrative embodiment, the reaction of the mixture may be performed using a neat reaction, and also be performed in the presence of a suitable solvent, as necessary. The mixture and the catalyst may be properly mixed, and used as the solvent. Also, any kind of solvent may be used as long as it does not affect the reactivity. Examples of the solvent that may be used herein may include an aliphatic hydrocarbon-based solvent such as n-pentane, i-pentane, n-hexane, i-hexane, 2,2,4-trimethylpentane, cyclohexane, or methylcyclohexane, an aromatic solvent such as benzene, toluene, xylene, trimethylbenzene, ethyl benzene, or methylethyl benzene, a ketone-based solvent such as methylethylketone, methylisobutylketone, diethylketone, methyl n-propyl ketone, methyl n-butyl ketone, cyclohexanone, methylcyclohexanone, or acetylacetone, an ether-based solvent such as tetrahydrofuran, 2-methyl tetrahydrofuran, ethyl ether, n-propyl ether, isopropyl ether, diglyme, dioxin, dimethyl dioxin, ethylene glycol monomethyl ether, ethylene glycol dimethyl ether, ethylene glycoldiethyl ether, propylene glycol monomethyl ether, or propylene glycol dimethyl ether, an ester-based solvent such as diethyl carbonate, methyl acetate, ethyl acetate, ethyl lactate, ethylene glycol monomethyl ether acetate, propylene glycol monomethyl ether acetate, or ethylene glycol diacetate, or an amide-based solvent such as N-methyl pyrrolidone, formamide, N-methyl formamide, N-ethyl formamide, N,N-dimethyl acetamide, or N,N-diethylacetamide, but the present application is not limited thereto.

According to one illustrative embodiment, the reaction of the mixture may be performed, for example, by optionally adding a catalyst to the mixture and reacting the catalyst with the mixture. The reaction temperature may be, for example, adjusted within a temperature of 0° C. to 150° C., or 30° C. to 130° C. Also, the reaction time may be, for example, adjusted within 1 to 72 hours, but the present application is not limited thereto.

According to one illustrative embodiment, the method may be a method of preparing a cross-linking organopolysiloxane. In this specification, the term "cross-linking organopolysiloxane" may refer to a trifunctional siloxane unit (hereinafter referred to as "unit T") which may be generally represented by ($RSiO_{3/2}$), or refer to an organopolysiloxane essentially including a tetrafunctional siloxane unit (hereinafter referred to as "unit Q") which may be generally represented by ($SiO_2$).

According to one illustrative embodiment, the cross-linking organopolysiloxane may have an average composition formula of the following Formula 7.

   Formula 7

In Formula 7, $R^1$ is a monovalent hydrocarbon group having at least two carbon atoms, $R^2$ is an alkyl group having 1 to 4 carbon atoms, $R^3$ and $R^4$ are each independently an alkyl group having 1 to 20 carbon atoms, an alkenyl group having 2 to 20 carbon atoms, or an aryl group having 6 to 25 carbon atoms, $R^5$ is an alkyl group having 1 to 20 carbon atoms, or an aryl group having 6 to 25 carbon atoms, provided that at least one of $R^1$, $R^3$ and $R^4$ is an alkenyl group, a is a positive number, b is 0 or a positive number, c is a positive number, and d is 0 or a positive number, provided that b/a is equal to or greater than 5, and b/c is equal to or greater than 5.

In the average composition formula of Formula 7, a to d each independently represent molar ratios of the respective siloxane units. Here, when the sum (a+b+c) is set to 1, a may be in a range of 0.01 to 0.20, b may be in a range of 0 to 1.8, or 0 to 0.98, c may be in a range of 0.01 to 0.30, and d may be in a range of 0 to 0.15.

The organopolysiloxane having an average composition formula of Formula 7 may include a monofunctional siloxane unit (hereinafter referred to as "unit M") which may be generally represented by ($R_3SiO_{1/2}$), a difunctional siloxane unit (hereinafter referred to as "unit D") which may be generally represented by ($R_2SiO_{2/2}$), a unit T and/or a unit Q.

According to one illustrative embodiment, the organopolysiloxane may have a sufficiently long linear structure derived from the unit D as well as a structure (hereinafter referred to as "cross-linking or branched structure") derived from the unit T or the unit Q, desirably the unit T, among the structures. In the illustrative organopolysiloxane, b/c in the average composition formula of Formula 7 may be equal to or greater than 5, 7, 8, or 10. Also, b/a in the average composition formula of Formula 7 may be equal to or greater than 5, 8, or 10. As such, an upper limit of b/c is not particularly limited, but may be, for example, 70, 60, 50, 40, 30, or 25. Also, an upper limit of b/a is also not particularly limited, but may be, for example, 110, 100, 90, 80, 70, 60, 50, or 40. In Formula 7, b/(a+b+c+d) may be, for example, equal to or greater than 0.5, 0.6, or 0.7. An upper limit of b/(a+b+c+d) is not particularly limited, but may be less than 1, or equal to or less than 0.98. In Formula 7, b/(b+c) may be, for example, equal to or greater than 0.5, 0.6, or 0.7. An upper limit of b/(b+c) is not particularly limited, but may be less than 1, or equal to or less than 0.98. When the organopolysiloxane has the above-described structure, the organopolysiloxane may show proper physical properties according to applications.

In Formula 7, at least one of $R^1$, $R^3$ and $R^4$ is an alkenyl group. According to one illustrative embodiment, the alkenyl group may be present at such a content that a molar ratio (Ak/Si) of the alkenyl groups (Ak) with respect to the total silicon atoms (Si) included in the organopolysiloxane of Formula 7 can be in a range of 0.02 to 0.2, or 0.02 to 0.15. When the molar ratio (Ak/Si) is adjusted to 0.02 or more, for example, reactivity with other components may be properly maintained during an addition curing reaction, and an unreacted component may be prevented from exuding from a surface of a cured product. Also, when the molar ratio (Ak/Si) is adjusted to 0.2 or less, crack resistance of a cured product obtained using the component may be maintained at an excellent level.

According to one illustrative embodiment, the organopolysiloxane having an average composition formula of Formula 7 may contain at least one aryl group bound to a silicon atom. In the illustrative organopolysiloxane, a molar ratio (Ar/Si) of aryl groups (Ar) bound to silicon atoms with respect to the total silicon atoms (Si) included in the organopolysiloxane may be equal to or greater than 0.3, 0.5, or 0.7. An upper limit of the molar ratio (Ar/Si) may be, for example, 1.5 or 1.3.

At least one of the aryl groups bound to the silicon atoms in the organopolysiloxane having an average composition formula of Formula 7 may be bound to a silicon atom of the unit D. That is, the illustrative organopolysiloxane may contain at least one aryl group bound to the silicon atom of the unit D. In this case, a molar ratio (Ar-D/Si) of aryl groups (Ar-D) bound to silicon atoms of the unit D with respect to the total silicon atoms (Si) included in the organopolysiloxane may be equal to or greater than 0.2, 0.4, or 0.6. According to the illustrative embodiments, an upper limit of the molar ratio (Ar-D/Si) is not particularly limited, and maybe, for example, 1.8 or 1.5.

At least one of the aryl groups bound to the silicon atom in the organopolysiloxane having an average composition formula of Formula 7 may be bound to a silicon atom of the unit T.

All the aryl groups bound to the silicon atoms included in the organopolysiloxane having an average composition formula of Formula 7 may be bound to silicon atoms of the units D and/or T, and also satisfy the above-described molar ratio (Ar/Si and/or Ar-D/Si).

According to one illustrative embodiment, the organopolysiloxane of Formula 7 may have an average composition formula of the following Formula 8.

$$(R^1R^2{}_2SiO_{1/2})_a(R^6R^7SiO_{2/2})_l(R^8R^9SiO_{2/2})_m(R^5SiO_{3/2})_c \quad \text{Formula 8}$$

In Formula 8, $R^1$, $R^2$ and $R^5$ are as defined in Formula 7, $R^6$ is an aryl group having 6 to 25 carbon atoms, and $R^7$, $R^8$ and $R^9$ are each independently an alkyl group having 1 to 20 carbon atoms, an alkenyl group having 2 to 20 carbon atoms, or an aryl group having 6 to 25 carbon atoms, provided that at least one of $R^1$, $R^7$, $R^8$ and $R^9$ is an alkenyl group, a may be in a range of 0.01 to 0.10, l may be in a range of 0 to 0.90, m may be in a range of 0 to 0.90, and c may be in a range of 0.01 to 0.30 when the sum (a+b+c) is set to 1, provided that (l+m)/a is equal to or greater than 5, and (l+m)/c is equal to or greater than 5.

In the average composition formula of Formula 8, a, l, m and c each independently represent molar ratios of respective siloxane units. Here, when the sum (a+l+m+c) is set to 1, a is in a range of 0.01 to 0.10, l is in a range of 0 to 0.90, m is in a range of 0 to 0.90, and c is in a range of 0.01 to 0.30. Also, when the sum of l and m is set to b of the average composition formula of Formula 7, a, l, m and c may be adjusted to satisfy the above-described molar ratios as listed in Formula 7. For example, (l+m)/c in Formula 8 may be equal to or greater than 5, 7, 8, or 10. In the average composition formula, (l+m)/a may also be equal to or greater than 5, 8, or 10. As such, an upper limit of (l+m)/c is not particularly limited, but may be, for example, 70, 60, 50, 40, 30, or 25. Also, an upper limit of (l+m)/a is not particularly limited, but may be, for example, 110, 100, 90, 80, 70, 60, 50, or 40. In Formula 7, (l+m)/(a+l+m+c) may be, for example, equal to or greater than 0.5, 0.6, or 0.7. An upper limit of (l+m)/(a+l+m+c) is not particularly limited, but may be less than 1, or equal to or less than 0.98. In Formula 9, (l+m)/(l+m+c) may be, for example, equal to or greater than 0.5, 0.6, or 0.7. An upper limit of the (l+m)/(l+m+c) is not particularly limited, but may be less than 1, or equal to or less than 0.98. When the organopolysiloxane has the above-described structure, the organopolysiloxane may show proper physical properties according to applications.

Also, l and m may not both be zero (0) in the average composition formula of Formula 8. When l and m are not both zero (0), l/m may be in a range of 0.4 to 2.0, 0.4 to 1.5, or 0.5 to 1.

According to one illustrative embodiment, the organopolysiloxane having an average composition formula of Formula 7 or 8 may include a unit represented by the following Formula 9 or 10.

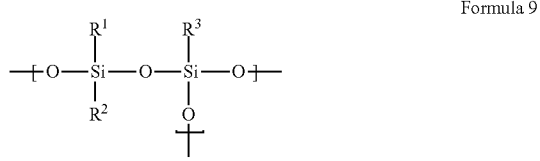

Formula 9

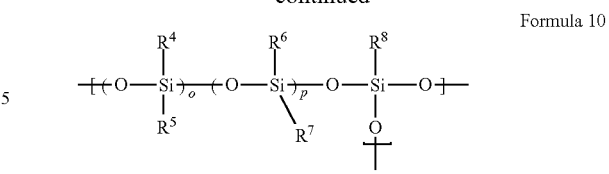

Formula 10

In Formulas 9 and 10, $R^1$ to $R^8$ are each independently an alkyl group having 1 to 20 carbon atoms, an alkenyl group having 2 to 20 carbon atoms, or an aryl group having 6 to 25 carbon atoms, o is in a range of 0 to 300, and p is in a range of 0 to 300.

In Formulas 9 and 10, $R^6$ to $R^8$ may be, for example, an aryl group.

The illustrative organopolysiloxane may include at least one unit of Formula 9 or 10. The unit of Formula 9 or 10 refers to a unit in which a silicon atom of the unit D and a silicon atom of the unit T are directly bound by means of an oxygen atom among the siloxane units forming an organopolysiloxane. According to one illustrative embodiment, the organopolysiloxane may include at least one single component containing the unit of Formula 9 or 10 when the organopolysiloxane is a mixture of two or more components and is also represented by the average composition formula of Formula 7 or 8, as described above.

According to one illustrative embodiment, in the organopolysiloxane having an average composition formula of Formula 7 or 8, an area ratio (OR/Ak) of areas of peaks (OR) derived from alkoxy groups bound to silicon atoms with respect to areas of peaks (Ak) derived from alkenyl groups bound to silicon atoms may be equal to or less than 0.05, 0.03, 0.01, or 0.005, or may be 0, as observed on the $^1$H NMR spectrum. Within this area ratio, the organopolysiloxane may have proper viscosity characteristics, and simultaneously show other excellent physical properties. As such, the spectrum measured by the $^1$H NMR assay is also specifically calculated using a method described in the following Examples.

According to one illustrative embodiment, the organopolysiloxane having an average composition formula of Formula 7 or 8 may also have an acid value of 0.05 mgKOH/g or less, 0.03 mgKOH/g or less, 0.01 mgKOH/g or less, or 0 mgKOH/g, as calculated by KOH titration. Within this acid value range, the organopolysiloxane may have proper viscosity characteristics, and simultaneously show other excellent physical properties. As such, the acid value measured by the KOH titration is also specifically calculated using a method described in the following Examples.

According to one illustrative embodiment, the organopolysiloxane having an average composition formula of Formula 7 or 8 may have a viscosity at 25° C. of 2,000 cP or more, 3,000 cP or more, 4,000 cP or more, 5,000 cP or more, 7,000 cP or more, 9,000 cP or more, or 9,500 cP or more. Within this viscosity range, processability and hardness characteristics of the organopolysiloxane may be properly maintained. Meanwhile, an upper limit of the viscosity is not particularly limited, but may be, for example, equal to or less than 100,000 cP, 90,000 cP, 80,000 cP, 70,000 cP, or 65,000 cP.

According to one illustrative embodiment, the organopolysiloxane having an average composition formula of Formula 7 or 8 may have a weight average molecular weight ($M_w$) of 1,500 or more, 2,000 or more, 3,000 or more, 4,000 or more, or 5,000 or more. In this specification, the term "weight average molecular weight" refers to a value converted with respect to a polystyrene standard as measured by gel permeation chromatography (GPC). Unless particularly defined otherwise in this specification, the term "molecular weight" may also refer to a weight average molecular weight. Within this molecular weight range, formability, hardness, and strength characteristics of the organopolysiloxane may be properly maintained. Meanwhile, an upper limit of the molecular weight is not particularly limited, but may be, for example, equal to or less than 14,000, 12,000, or 10,000.

According to one illustrative embodiment, the reaction product formed by the reaction of the mixture may include a compound represented by the following Formula 11.

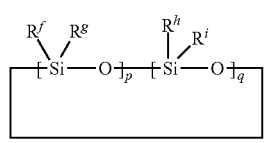

Formula 11

In Formula 11, $R^f$ and $R^g$ are each independently an alkyl group having 1 to 20 carbon atoms, $R^h$ and $R^i$ are each independently an aryl group having 6 to 25 carbon atoms, p is an integer ranging from 0 to 10, or 3 to 10, and q is an integer ranging from 0 to 10, or 3 to 10.

The compound of Formula 11 is a kind of a low molecular weight component included in the reaction product. In this specification, the term "low molecular weight component" may refer to a component having a molecular weight of 800 or less, which is included in the reaction product.

After the reaction, the method may further include adjusting a content of a low molecular weight component, for example, a low molecular weight component including the compound of Formula 11 to 10% by weight or less, 8% by weight or less, or 6% by weight or less. A desired product having excellent physical properties may be obtained by removing such a low molecular weight component. A method of removing the low molecular weight component is not particularly limited. For example, the removal of the low molecular weight component may be performed using a conventional purification method known in the related art.

Another aspect of the present application provides a method of manufacturing a semiconductor device. The illustrative method of manufacturing a semiconductor device may include encapsulating a semiconductor element with a composition including the organopolysiloxane prepared using the above-described method.

The composition may include only the organopolysiloxane, or may further include another component that can cure the organopolysiloxane, for example, a hydroxylation catalyst such as a platinum-based catalyst, or a siloxane compound containing at least one hydrogen atom bound to a silicon atom, which may be used as a cross-linking agent, as necessary.

Also, the composition may further include a tackifier as a component which can serve to improve adhesivity to a metal or an organic resin. The tackifier that may be used herein may include a silane compound containing one or more, for example, two or more, functional groups selected from the group consisting of an alkenyl group (i.e., a vinyl group), a (meth)acryloyloxy group, a hydrosilyl (SiH) group, an epoxy group, an alkoxy group, an alkoxysilyl group, a carbonyl group, and a phenyl group; or an organic silicon compound such as a cyclic or linear siloxane having 2 to 30 silicon atoms, for example, 4 to 20 silicon atoms, but the present application is not limited thereto.

As necessary, the composition may also further include at least one or two additives such as a reaction inhibitor such as 2-methyl-3-butyn-2-ol, 2-phenyl-3-1-butyn-2-ol, 3-methyl-3-penten-1-yne, 3,5-dimethyl-3-hexen-1-yne, 1,3,5,7-tetramethyl-1,3,5,7-tetrahexenylcyclotetrasiloxane, or ethynylcyclohexane; an inorganic filler such as silica, alumina, zirconia, or titania; a carbon-functional silane and a partial hydrolyzed/condensed product thereof, which contains an epoxy group and/or an alkoxysilyl group, or a siloxane compound; a thixotropic agent, such as fumed silica, which may be used together with a polyether; an antistatic-conducting agent such as a metal powder (for example, silver, copper, or aluminum), or various carbon materials; a color control agent such as a pigment or a dye; or a fluorescent material.

Examples of the semiconductor element encapsulated by the composition may include a diode, a transistor, a thyristor, a photo coupler, a charge coupled device (CCD), a solid-phase image pickup device, an integral integrated circuit (IC), a hybrid IC, a large-scale integration (LSI), a very-large-scale integration (VLSI) and a light-emitting diode (LED).

According to one illustrative embodiment, the semiconductor element may be an LED. In this case, the method of manufacturing a semiconductor device may be a method of manufacturing an LED including encapsulating a light-emitting element with the composition.

For example, the LED that may be used herein may include an LED formed by stacking a semiconductor material on a substrate. Examples of the semiconductor material may include GaAs, GaP, GaAlAs, GaAsP, AlGaInP, GaN, InN, MN, InGaAlN or SiC, but the present application is not limited thereto. Also, examples of the substrate may include a monocrystalline material such as sapphire, spinel, SiC, Si, ZnO or GaN.

In manufacture of an LED, a buffer layer may also be formed between the substrate and the semiconductor material, as necessary. GaN or MN may be used as the buffer layer. A method of stacking a semiconductor material on a substrate is not particularly limited. For example, the semiconductor material may be stacked using a method such as metal organic chemical vapor deposition (MOCVD), hydride vapor phase epitaxy (HDVPE) or congruent melt growth. Also, a structure of the LED may be, for example, a monojunction, a heterojunction, or a dual heterojunction junction such as an MIS junction, a PN junction, or a PIN junction. Also, the LED may be formed with a single or multiple quantum well structure.

According to one illustrative embodiment, an emission wavelength of the LED may be, for example, in a range of 250 nm to 550 nm, 300 nm to 500 nm, or 330 nm to 470 nm. The emission wavelength may refer to a major emission peak wavelength. When the emission wavelength of the LED is set to this wavelength range, a white light emitting diode having high energy efficiency and excellent color reproducibility may be obtained with a longer lifespan.

A method of encapsulating the semiconductor element or light-emitting element using the composition is not particularly limited.

According to one illustrative embodiment, a method of encapsulating a semiconductor element or a light-emitting element using the composition may, for example, include a method of injecting the composition into a mold-type cast in advance, dipping a lead frame in which the element is fixed in the composition and optionally curing the composition, or a method of injecting a composition into a cast having the element inserted therein and optionally curing the composition. A method of injecting a composition may include injection using a dispenser, transfer molding, or injection molding.

As the other encapsulation method, a method of coating a composition on an element using a method such as dripping, stencil printing, or screen printing, or a mask and optionally curing the composition, or a method of injecting a composition into a cup having an element disposed at a lower portion thereof using a dispenser and optionally curing the composition may also be used.

When curing of the composition is required during an encapsulation process, a curing method is not particularly limited. For example, the composition may be cured at a constant temperature of 60° C. to 200° C. for 10 minutes to 5 hours, or a series of curing processes may be carried out by performing two or more operations at a suitable temperature for a suitable period of time.

A shape of an encapsulation material is not particularly limited. For example, the encapsulation material may be formed in the form of a shell-shaped lens, a plate or a thin film.

The encapsulation may be carried out as follows. The element may be encapsulated only by the composition, or optionally encapsulated by another encapsulation material together with the composition. When the 2 kinds of encapsulation materials are used together, encapsulation of the element may be performed by encapsulating an element with the composition and encapsulating the composition with another encapsulation material, or by encapsulating an element with another encapsulation material and encapsulating the encapsulation material with the curable composition. Another encapsulation material may include an epoxy resin, a silicone resin, an acrylic resin, a urea resin, an imide resin, or glass, but the present application is not limited thereto.

In addition to this encapsulation method, another encapsulation method known in the prior art may be performed to further improve the performance of the semiconductor device or LED. For example, a method of improving the performance may include a method of installing a light-reflecting layer or a light-condensing layer in a rear surface of an LED, a method of forming a complementary color-tinting unit at a bottom surface of an LED, a method of installing a layer for absorbing light having a shorter wavelength than a major emission peak on an LED, a method of encapsulating an LED and further molding the LED with a hard material, a method of inserting and fixing an LED in a through hole, or a method of bringing an LED into contact with a lead member using a method such as flip-chip bonding and extracting light in a direction of a substrate.

For example, the LED may be effectively applied to backlights for liquid crystal display devices (LCDs), lightings, light sources for various sensors, printers or photocopiers, light sources for dashboards in vehicles, traffic lights, pilot lamps, light sources for display devices or planar light-emitting bodies, displays, decorations, or various lights.

Advantageous Effects

According to one illustrative method, the organopolysiloxane, which has both a linear or cross-linking structure derived from a trifunctional siloxane unit and a linear structure derived from a difunctional siloxane unit among the molecular structures and also has a sufficiently long linear structure, can be effectively prepared. According to the illustrative method, the organopolysiloxane can also be synthesized so that it can have a sufficiently high molecular weight, and a target product showing excellent physical properties can be effectively prepared by minimizing a ratio of a functional group such as an alkoxy group or a hydroxyl group in the synthesized organopolysiloxane.

BEST MODES OF THE INVENTION

Hereinafter, the present application will be described in detail with reference to Examples and Comparative Examples. However, it should be understood that the following Examples are not intended to limit the scope of the present application.

Hereinafter, the symbol "Vi" represents a vinyl group, the symbol "Ph" represents a phenyl group, and the symbol "Me" represents a methyl group.

Also, the physical properties are measured as follows.

1. $^1$H-NMR measurement of organopolysiloxane

A $^1$H-NMR assay on an organopolysiloxane was performed under the following conditions.

<Specifications for $^1$H-NMR assay>

Measuring machine: Varian Unity Inova 500 MHz NMR
Solvent used: acetone-d6
Measurement conditions:
Pulse sequence: s2pul
Sweep width: 8012.8 Hz
Acquisition time: 2.045 sec
Delay time: 2 sec
Pulse width: 45 degree pulse (8.10 μsec)
Number of scans: 16

2. Measurement of acid value of organopolysiloxane

A solvent for measurement was prepared by blending 500 mL of toluene, 495 mL of isopropyl alcohol (IPA) and 5 mL of water (i.e., distilled water). Also, a 0.1 N KOH solution (including IPA as the solvent) was prepared as a base solvent (i.e., a base solution), and alpha-naphtholbenzein (yellow at pH 0.8 to 8.2, and blue green at pH 10.0) was prepared as an indicator. Thereafter, approximately 1 to 2 g of a reagent was taken and dissolved in 6 g of a solvent for measurement. Then, an indicator was added to the resulting mixture, and titrated with a base solvent. An acid value (unit: mg KOH/g) was calculated from an amount of the base solvent used when the titration was completed.

Example 1

60.00 g of octamethylcyclotetrasiloxane, 106.96 g of octaphenylcyclotetrasiloxane, 17.44 g of octaphenyl-polyhedral oligomeric silsesquioxane (octaphenyl-POSS) and 12.56 g of divinyltetramethyldisiloxane were mixed, and 0.63 mL of tetramethylammonium hydroxide (TMAH) was mixed with the resulting mixture as a catalyst. Thereafter, the mixture including the catalyst was reacted at a temperature of 115° C. for approximately 20 hours to obtain a polysiloxane in the form of a transparent oil, which was represented by the following Formula A. The polysiloxane had a viscosity at 25° C. of 21,000 cP and a molecular weight of approximately 6,400. Also, the peak derived from an alkoxy group was not observed on the spectrum as measured using a $^1$H-NMR assay, and the acid value was measured to be approximately 0.006 mg KOH/g.

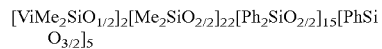

Formula A

Example 2

A polysiloxane was synthesized in the same manner as in Example 1, except that the divinyltetramethyldisiloxane was blended at a content of 6.28 g. The polysiloxane was represented by the following Formula B, and prepared in the form of a transparent oil. Here, the polysiloxane had a viscosity at 25° C. of 58,600 cP and a molecular weight of approximately 9,700. Also, the peak derived from an alkoxy group was not observed on the spectrum as measured using a $^1$H-NMR assay, and the acid value was measured to be approximately 0.009 mg KOH/g.

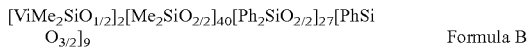

$[ViMe_2SiO_{1/2}]_2[Me_2SiO_{2/2}]_{40}[Ph_2SiO_{2/2}]_{27}[PhSiO_{3/2}]_9$   Formula B

Example 3

A polysiloxane was synthesized in the same manner as in Example 1, except that the octaphenyl-POSS and the divinyltetramethyldisiloxane were blended at contents of 34.88 g and 15.72 g, respectively. The polysiloxane was represented by the following Formula C, and prepared in the form of a transparent oil. Here, the polysiloxane had a viscosity at 25° C. of 33,200 cP and a molecular weight of approximately 4,600. Also, the peak derived from an alkoxy group was not observed on the spectrum as measured using a $^1$H-NMR assay, and the acid value was measured to be approximately 0.008 mg KOH/g.

$[ViMe_2SiO_{1/2}]_2[Me_2SiO_{2/2}]_{19}[Ph_2SiO_{2/2}]_{12}[PhSiO_{3/2}]_6$   Formula C

Example 4

A polysiloxane was synthesized in the same manner as in Example 1, except that the octamethylcyclotetrasiloxane, the octaphenylcyclotetrasiloxane and the divinyltetramethyldisiloxane were blended at contents of 55.00 g, 120.34 g and 18.85 g, respectively. The polysiloxane was represented by the following Formula D, and prepared in the form of a transparent oil. Here, the polysiloxane had a viscosity at 25° C. of 24,400 cP and a molecular weight of approximately 4,200. Also, the peak derived from an alkoxy group was not observed on the spectrum as measured using a $^1$H-NMR assay, and the acid value was measured to be approximately 0.008 mg KOH/g.

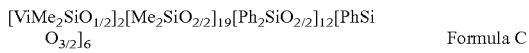

$[ViMe_2SiO_{1/2}]_2[MeSiO_{2/2}]_{14}[PhSiO_{2/2}]_{11}[PhSiO_{3/2}]_3$   Formula D

Example 5

A polysiloxane was synthesized in the same manner as in Example 4, except that the divinyltetramethyldisiloxane was blended at a content of 12.56 g. The polysiloxane was represented by the following Formula E, and prepared in the form of a transparent oil. Here, the polysiloxane had a viscosity at 25° C. of 47,000 cP and a molecular weight of approximately 5,500. Also, the peak derived from an alkoxy group was not observed on the spectrum as measured using a $^1$H-NMR assay, and the acid value was measured to be approximately 0.007 mg KOH/g.

$[ViMe_2SiO_{1/2}]_2[Me_2SiO_{2/2}]_{21}[Ph_2SiO_{2/2}]_{17}[PhSiO_{3/2}]_4$   Formula E

Example 6

A polysiloxane was synthesized in the same manner as in Example 1, except that 183.71 g of tetramethyltetraphenylcyclotetrasiloxane was blended without using the octamethylcyclotetrasiloxane and the octaphenylcyclotetrasiloxane, and the divinyltetramethyldisiloxane was blended at a content

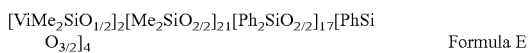

of 12.10 g. The polysiloxane was represented by the following Formula F, and prepared in the form of a transparent oil. Here, the polysiloxane had a viscosity at 25° C. of 19,800 cP and a molecular weight of approximately 4,800. Also, the peak derived from an alkoxy group was not observed on the spectrum as measured using a $^1$H-NMR assay, and the acid value was measured to be approximately 0.008 mg KOH/g.

$[ViMe_2SiO_{1/2}]_2[MePhSiO_{2/2}]_{32}[PhSiO_{3/2}]_4$   Formula F

Example 7

30.0 g of octamethylcyclotetrasiloxane, 53.5 g of octaphenylcyclotetrasiloxane, 8.7 g of octaphenyl-POSS, and 6.3 g of divinyltetramethyldisiloxane were mixed, and 0.3 mL of tetramethylammonium hydroxide was mixed with the resulting mixture as a catalyst. Thereafter, the mixture including the catalyst was reacted at a temperature of 115° C. for approximately 20 hours. After the reaction was completed, a low molecular weight material was removed from the reaction product to obtain a polysiloxane in the form of a transparent oil, which was represented by the following Formula G. The polysiloxane had a viscosity at 25° C. of 21,000 cP and a molecular weight of approximately 6,100. Also, the peak derived from an alkoxy group was not observed on the spectrum as measured using a $^1$H-NMR assay, and the acid value was measured to be approximately 0.01 mg KOH/g.

$[ViMe_2SiO_{1/2}]_2[Me_2SiO_{2/2}]_{23}[Ph_2SiO_{2/2}]_{15}[PhSiO_{3/2}]_4$   Formula G

Example 8

A polysiloxane was synthesized in the same manner as in Example 7, except that the octaphenyl-POSS was blended at a content of 4.4 g. The polysiloxane was represented by the following Formula H, and prepared in the form of a transparent oil. Here, the polysiloxane had a viscosity at 25° C. of 10,200 cP and a molecular weight of approximately 5,600. Also, the peak derived from an alkoxy group was not observed on the spectrum as measured using a $^1$H-NMR assay, and the acid value was measured to be approximately 0.009 mg KOH/g.

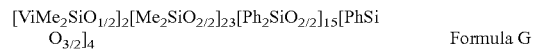

$[ViMe_2SiO_{1/2}]_2[Me_2SiO_{2/2}]_{24}[Ph_2SiO_{2/2}]_{16}[PhSiO_{3/2}]_2$   Formula H

Example 9

A polysiloxane was synthesized in the same manner as in Example 7, except that the divinyltetramethyldisiloxane was blended at a content of 9.4 g. The polysiloxane was represented by the following Formula I, and prepared in the form of a transparent oil. Here, the polysiloxane had a viscosity at 25° C. of 12,200 cP and a molecular weight of approximately 4,700. Also, the peak derived from an alkoxy group was not observed on the spectrum as measured using a $^1$H-NMR assay, and the acid value was measured to be approximately 0.008 mg KOH/g.

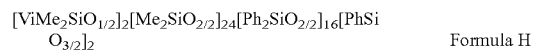

$[ViMe_2SiO_{1/2}]_2[Me_2SiO_{2/2}]_{17}[Ph_2SiO_{2/2}]_{11}[PhSiO_{3/2}]_4$   Formula I

Example 10

A polysiloxane was synthesized in the same manner as in Example 7, except that the octamethylcyclotetrasiloxane, the octaphenylcyclotetrasiloxane and the divinyltetramethyldisi-

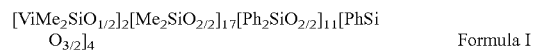

loxane were blended at contents of 27.5 g, 60.2 g and 7.9 g, respectively. The polysiloxane was represented by the following Formula J, and prepared in the form of a transparent oil. Here, the polysiloxane had a viscosity at 25° C. of 33,200 cP and a molecular weight of approximately 4,600. Also, the peak derived from an alkoxy group was not observed on the spectrum as measured using a $^1$H-NMR assay, and the acid value was measured to be approximately 0.007 mg KOH/g.

$$[ViMe_2SiO_{1/2}]_2[Me_2SiO_{2/2}]_{18}[Ph_2SiO_{2/2}]_{15}[PhSiO_{3/2}]_2 \quad \text{Formula J}$$

Example 11

A polysiloxane was synthesized in the same manner as in Example 7, except that 12.5 g of a polysiloxane, which was represented by the Formula $[ViMe_2SiO_{1/2}][PhSiO_{3/2}]_{3.5}$ and had a molecular weight of 1,520, was used instead of the octaphenyl-POSS, and the divinyltetramethyldisiloxane was blended at a content of 6.1 g. The polysiloxane was represented by the following Formula K, and prepared in the form of a transparent oil. Here, the polysiloxane had a viscosity at 25° C. of 15,500 cP and a molecular weight of approximately 5,300. Also, the peak derived from an alkoxy group was not observed on the spectrum as measured using a $^1$H-NMR assay, and the acid value was measured to be approximately 0.012 mg KOH/g.

$$[ViMe_2SiO_{1/2}]_2[Me_2SiO_{2/2}]_{20}[Ph_2SiO_{2/2}]_{13}[PhSiO_{3/2}]_4 \quad \text{Formula K}$$

Example 12

75.00 g of octamethylcyclotetrasiloxane, 468 g of octaphenylcyclotetrasiloxane, and 17.44 g of an organopolysiloxane having an average composition unit: $(ViMe_2SiO_{1/2})_3(PhSiO_{3/2})$ were mixed, and 2 mL of tetramethylammonium hydroxide (TMAH) was blended with the resulting mixture as a catalyst. Thereafter, the mixture including the catalyst was reacted at a temperature of 115° C. for approximately 20 hours to obtain a polysiloxane in the form of a transparent oil, which was represented by the following Formula L. The polysiloxane had a viscosity at 25° C. of 20,200 cP and a molecular weight of approximately 1,800. Also, the peak derived from an alkoxy group was not observed on the spectrum as measured using a $^1$H-NMR assay, and the acid value was measured to be approximately 0.006 mg KOH/g.

$$[ViMe_2SiO_{1/2}]_2[Me_2SiO_{2/2}]_3[Ph_2SiO_{2/2}]_7[PhSiO_{3/2}]_2 \quad \text{Formula F}$$

Comparative Example 1

A solution obtained by dissolving 97.2 g of dimethoxydimethylsilane, 131.8 g of dimethoxydiphenylsilane, 12.6 g of divinyltetramethyldisiloxane and 26.6 g of phenyltrimethoxysilane in 130 g of toluene was further blended with 106.0 g of water and 8.6 mL of nitric acid. Thereafter, the resulting mixture was reacted at a temperature of 100° C. for approximately 7 hours. When the reaction was completed, the reaction solution was cooled at room temperature, and washed with water until a reaction solution became neutral. Subsequently, 0.2 g of KOH was added to the reaction solution, followed by performing dehydration and condensation reactions. After the reaction, the reaction solution was neutralized with acetyl hydroxide (AcOH), and washed with water until the reaction solution became neutral. Then, a solvent was removed through vacuum distillation to obtain a polysiloxane. The obtained polysiloxane was prepared in the form of an oil with no transparency, and included a large amount of a low molecular weight material having a ring structure. In this case, the polysiloxane was not easily separated from the low molecular weight material since the polysiloxane had a molecular weight similar to the low molecular weight material. As observed on the $^1$H NMR spectrum, it was also confirmed that a large amount of methoxy groups were present in the structure since an area ratio (OMe/Vi) of areas of peaks (Vi) derived from vinyl groups with respect to areas of peaks (OMe) derived from the methoxy groups was approximately 0.1. Also, the acid value was measured to be approximately 0.063. It was revealed that the reaction solution had a very low viscosity at 25° C. of 1,300 cP.

Comparative Example 2

A polysiloxane was synthesized in the same manner as in Example 1, except that 26.8 g of phenyltrimethoxysilane was used instead of the octaphenyl-POSS. The synthesized polysiloxane included a large amount of a low molecular weight material having a ring structure. However, the polysiloxane was not easily separated from the low molecular weight material since the polysiloxane had a molecular weight similar to the low molecular weight material. As observed on the $^1$H NMR spectrum, it was also confirmed that a large amount of methoxy groups were present in the structure since an area ratio (OMe/Vi) of areas of peaks (Vi) derived from vinyl groups with respect to areas of peaks (OMe) derived from the methoxy groups was approximately 0.8. Also, the acid value was measured to be approximately 0.347. It was revealed that the reaction solution had a very low viscosity at 25° C. of 3,100 cP.

The invention claimed is:

1. A method for preparing an organopolysiloxane, comprising reacting a mixture comprising a compound represented by the Formula 1; and an organopolysiloxane having an average composition formula of the following Formula 2 or 3:

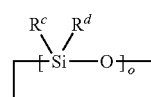

Formula 1

Formula 2

$[R^eSiO_{3/2}]$

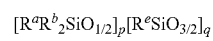

Formula 3

$[R^aR^b{}_2SiO_{1/2}]_p[R^eSiO_{3/2}]_q$ wherein $R^a$ is a monovalent hydrocarbon group having at least two carbon atoms, $R^b$ is an alkyl group having 1 to 4 carbon atoms, $R^c$ to $R^e$ are each independently an alkyl group having 1 to 20 carbon atoms, an alkenyl group having 1 to 20 carbon atoms, or an aryl group having 6 to 25 carbon atoms, o is ranging from 3 to 6, p is ranging from 1 to 3, and q is ranging from 1 to 10, and wherein the mixture further includes a compound represented by the following Formula 6:

$(R^aR^b{}_2Si)_2O$ \quad Formula 6 wherein $R^a$ is a monovalent hydrocarbon group having at least two carbon atoms, and $R^b$ is an alkyl group having 1 to 4 carbon atoms.

2. The method of claim 1, wherein the monovalent hydrocarbon group is an alkyl group, an alkenyl group, or an aryl group.

3. The method of claim 1, wherein the compound of Formula 1 is a mixture of a compound represented by the following Formula 4 and a compound represented by the following Formula 5:

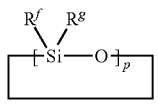

Formula 4

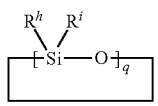

Formula 5 wherein $R^f$ and $R^g$ are each independently an alkyl group having 1 to 20 carbon atoms, $R^h$ and $R^i$ are each independently an aryl group having 6 to 25 carbon atoms, p is an integer ranging from 3 to 10, and q is an integer ranging from 3 to 10.

4. The method of claim 1, wherein the reaction of the mixture is performed in the presence of a base catalyst.

5. The method of claim 4, wherein the base catalyst is a metal oxide, a metal silanolate, or a quaternary ammonium compound.

6. The method of claim 1, wherein the reaction of the mixture is performed in a solvent.

7. The method of claim 6, wherein the solvent is an aliphatic hydrocarbon-based solvent, an aromatic solvent, a ketone-based solvent, an ether-based solvent, an ester-based solvent, or an amide-based solvent.

8. The method of claim 1, wherein the reaction of the mixture is performed at a temperature of 0° C. to 150° C.

9. The method of claim 1, wherein the reaction of the mixture is performed for 1 to 72 hours.

10. The method of claim 1, wherein the reaction product comprises a compound represented by the following Formula 7:

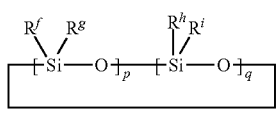

Formula 7 wherein $R^f$ and $R^g$ are each independently an alkyl group having 1 to 20 carbon atoms, $R^h$ and $R^i$ are each independently an aryl group having 6 to 25 carbon atoms, p is an integer ranging from 0 to 10, and q is an integer ranging from 0 to 10.

11. The method of claim 1, further comprising:
controlling a content of a low molecular weight material having a weight average molecular weight of 800 or less, which is included in the reaction product, to a content equal to or less than 30% by weight.

12. The method of claim 1, wherein the organopolysiloxane has an average composition formula of the following Formula 7:

$(R^1R^2{}_2SiO_{1/2})_a(R^3R^4SiO_{2/2})_b(R^5SiO_{3/2})_c(SiO_2)_d$     Formula 7 wherein $R^1$ is a monovalent hydrocarbon group having at least two carbon atoms, $R^2$ is an alkyl group having 1 to 4 carbon atoms, $R^3$ and $R^4$ are each independently an alkyl group having 1 to 20 carbon atoms, an alkenyl group having 2 to 20 carbon atoms, or an aryl group having 6 to 25 carbon atoms, and $R^5$ is an alkyl group having 1 to 20 carbon atoms, or an aryl group having 6 to 25 carbon atoms, provided that at least one of $R^1$, $R^3$ and $R^4$ represents an alkenyl group, a is a positive number, b is 0 or a positive number, c is a positive number, and d is 0, provided that b/a is equal to or greater than 5, and b/c is equal to or greater than 5.

13. The method of claim 12, wherein an area ratio of areas of peaks derived from alkoxy groups bound to silicon atoms with respect to areas of peaks derived from alkenyl groups bound to silicon atoms is equal to or less than 0.05 in the organopolysiloxane having an average composition formula of Formula 8, as observed on the $^1$H NMR spectrum.

14. The method of claim 12, wherein the organopolysiloxane having an average composition formula of Formula 8 has an acid value of 0.05 mgKOH/g or less, as calculated by KOH titration.

15. A method of manufacturing a semiconductor device, comprising:
encapsulating a semiconductor element with a composition including the organopolysiloxane prepared by the method defined in claim 1.

16. A method of manufacturing a light-emitting diode, comprising:
encapsulating a light-emitting element with a composition including the organopolysiloxane prepared by the method defined in claim 1.

\* \* \* \* \*